United States Patent
Choi et al.

(10) Patent No.: US 8,138,416 B2
(45) Date of Patent: Mar. 20, 2012

(54) SOLAR CELL AND METHOD FOR MANUFACTURING THE SAME

(75) Inventors: Junhee Choi, Seongnam-si (KR); Jai Yong Han, Suwon-si (KR); Andrei Zoulkarneev, Suwon-si (KR)

(73) Assignees: Samsung Electronics Co., Ltd., Suwon-si, Gyeonggi-do (KR); Samsung SDI Co., Ltd., Yongin-si, Gyunggi-do (KR)

( * ) Notice: Subject to any disclaimer, the term of this patent is extended or adjusted under 35 U.S.C. 154(b) by 465 days.

(21) Appl. No.: 12/320,924

(22) Filed: Feb. 9, 2009

(65) Prior Publication Data
US 2009/0250112 A1    Oct. 8, 2009

(30) Foreign Application Priority Data
Apr. 7, 2008    (KR) .................. 10-2008-0032072

(51) Int. Cl.
*H01L 31/00*    (2006.01)
(52) U.S. Cl. ........ 136/262; 136/244; 136/255; 136/256; 136/259
(58) Field of Classification Search .................. 136/252, 136/262, 244, 255, 256, 259
See application file for complete search history.

(56) References Cited

U.S. PATENT DOCUMENTS

| | | | |
|---|---|---|---|
| 5,034,068 A * | 7/1991 | Glenn et al. .................. | 136/256 |
| 5,853,497 A * | 12/1998 | Lillington et al. ............ | 136/249 |
| 7,217,882 B2 * | 5/2007 | Walukiewicz et al. ........ | 136/252 |
| 2003/0075213 A1 * | 4/2003 | Chen ............................. | 136/246 |
| 2008/0245400 A1 * | 10/2008 | Li ................................. | 136/244 |

* cited by examiner

*Primary Examiner* — Basia Ridley
*Assistant Examiner* — Devina Pillay
(74) *Attorney, Agent, or Firm* — Lee & Morse, P.C.

(57) ABSTRACT

Disclosed are a relatively high-efficiency solar cell and a method for fabricating the same using a micro-heater array. The solar cell may include first and second micro-heaters intersecting each other or being parallel to each other on a substrate, and a plurality of $In_xGa_{1-x}N$ p-n junction layers formed using the first and second micro-heaters. The solar cell has improved efficiency because sunlight with various wavelengths may be effectively absorbed by the plurality of $In_xGa_{1-x}N$ p-n junction layers. Furthermore, relatively large-sized solar cells may be fabricated, because the plurality of $In_xGa_{1-x}N$ p-n junction layers may be formed on a glass substrate using a micro-heater array.

10 Claims, 15 Drawing Sheets

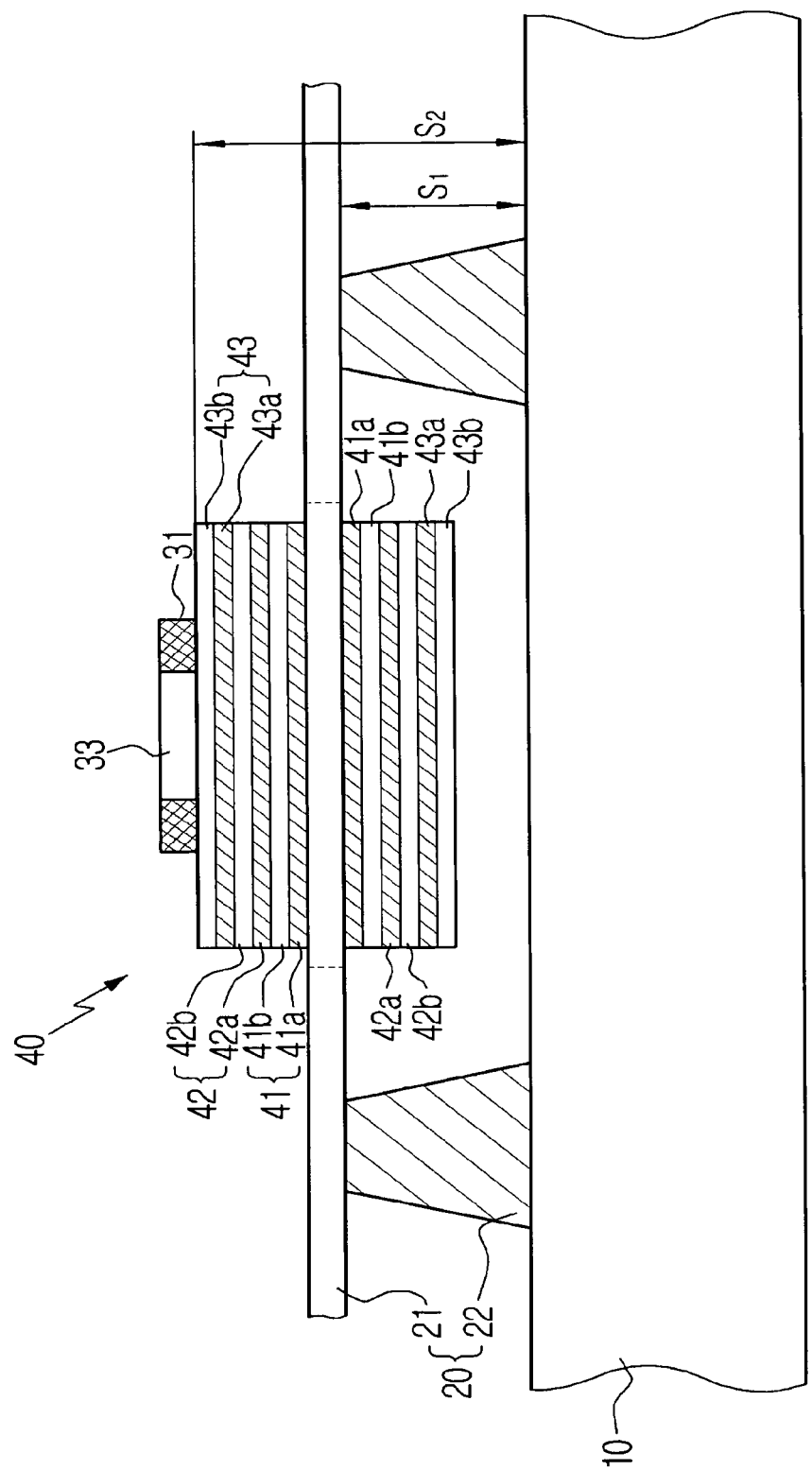

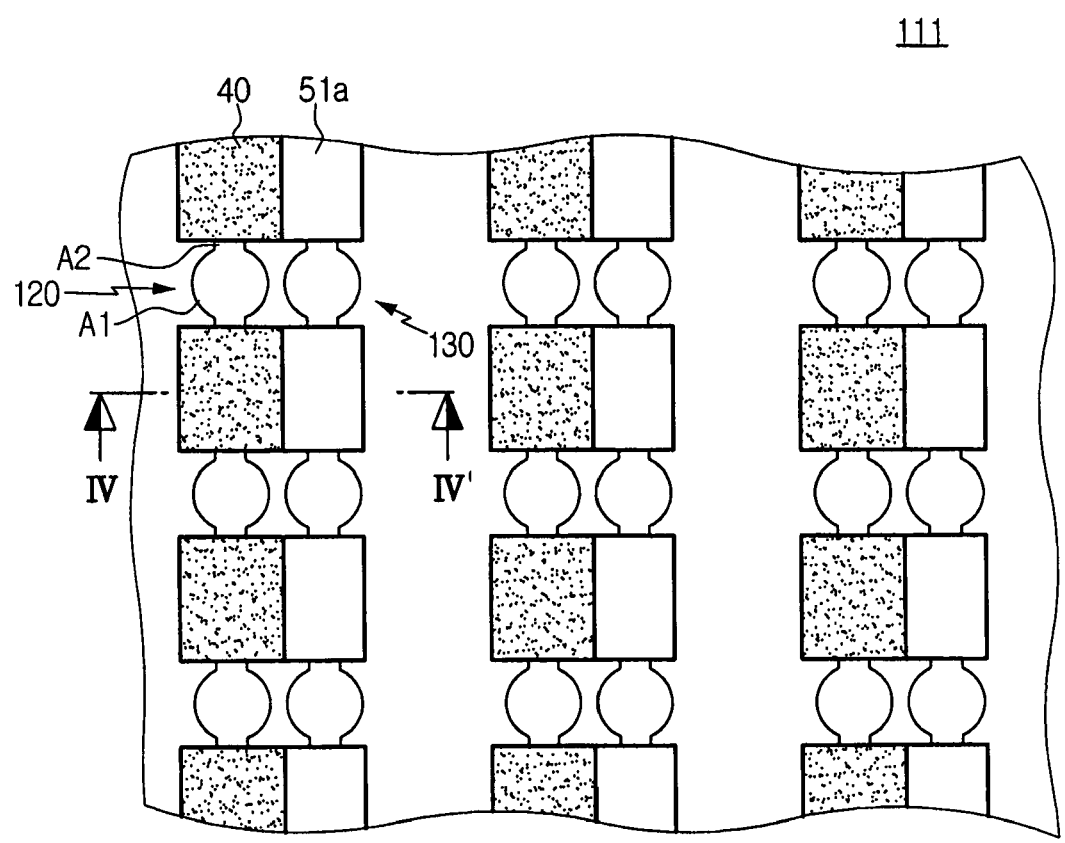

SOLAR CELL AND METHOD FOR MANUFACTURING THE SAME

CROSS-REFERENCE TO RELATED APPLICATION

This application claims priority under 35 U.S.C. §119 to Korean Patent Application No. 10-2008-0032072, filed Apr. 7, 2008, the entire disclosure of which is incorporated herein by reference.

BACKGROUND

1. Field

Example embodiments relate to solar cells and methods for fabricating the same.

2. Description of the Related Art

Conventionally, a p-n junction is used not only as a diode for rectifying operations but also for opto-electronic devices (e.g., solar cells, light emitting diodes (LEDs), and image sensors). When fabricating p-n junctions for general-use single-layered solar cells, silicon (Si) is used as the host material, and phosphorous (P) and boron (B) may be added as n-type and p-type doping materials, respectively. However, a single-layered solar cell is disadvantageous, because it has low efficiency.

The efficiency of a solar cell is affected by the band gap ($E_g$) of the host material. For example, a solar cell with a host material having a large band gap is inefficient, because it cannot absorb light having energy smaller than the band gap. In contrast, a solar cell with a host material having a small band gap is also inefficient, because (although it can absorb light having energy larger than the band gap) the surplus energy beyond the band gap is lost as heat. Of the host materials used in single-layered solar cells, CdTe has the highest efficiency of 31%, but this is still relatively low.

Because sunlight has a broad range of wavelengths, a host material capable of absorbing the broad range of wavelengths is required to effectively utilize sunlight as a source of electrical energy. A large-sized, high-efficiency solar cell may be attained by forming a high-quality p-n junction on a glass substrate. However, a high temperature of 1000° C. or more is typically required to form a high-quality p-n junction. For this reason, the substrate used to form the high-quality p-n junction is restricted to relatively expensive substrates (e.g., silicon wafer, $Al_2O_3$, SiC). Accordingly, there is increased difficulty and costs associated with the manufacture of large-sized p-n junctions and large-sized solar cells.

SUMMARY

Disclosed herein is a higher-efficiency, multi-stacked solar cell that utilizes a micro-heater array. A solar cell using a micro-heater array may include a substrate, a first micro-heater, a second micro-heater, and a plurality of $In_xGa_{1-x}N$ p-n junction layers, x being a number from 0 to 1.

In example embodiments, the first micro-heater may include a first heating portion spaced apart from the substrate and extending in a first direction; and first supports provided on the substrate so as to be spaced from one another and supporting the first heating portion. The second micro-heater may include a second heating portion extending in a second direction perpendicular to the first direction so as to traverse the first heating portion; and second supports provided on the substrate so as to be spaced from one another and supporting the second heating portion. There may be one or more of the first and second micro-heaters.

The plurality of $In_xGa_{1-x}N$ p-n junction layers may be formed on one or more of the first and second heating portions at a juncture of the first and second heating portions (e.g., intersection area where the second heating portion traverses the first heating portion) by the heat generated from the first or second heating portion. The plurality of $In_xGa_{1-x}N$ p-n junction layers may be electrically connected to the first and second heating portions and absorb sunlight from the external environment. In the plurality of $In_xGa_{1-x}N$ p-n junction layers, each layer may have a different value for x.

In example embodiments, a solar cell may further include a lens provided above the second heating portion and corresponding to the area where the plurality of $In_xGa_{1-x}N$ p-n junction layers are formed so as to focus sunlight onto the plurality of $In_xGa_{1-x}N$ p-n junction layers.

In other example embodiments, a first micro-heater may include a first heating portion spaced apart from the substrate and extending in a first direction; and first supports provided on the substrate so as to be spaced from one another and supporting the first heating portion. A second micro-heater may include a second heating portion spaced apart from the substrate and provided parallel to the first heating portion; and second supports provided on the substrate to be spaced from one another and supporting the second heating portion. A plurality of $In_xGa_{1-x}N$ p-n junction layers may be formed on one or more of the first and second heating portions by the heat generated from the first or second heating portion. The plurality of $In_xGa_{1-x}N$ p-n junction layers may be electrically connected to the first and second heating portions and absorb sunlight from the external environment. In the plurality of $In_xGa_{1-x}N$ p-n junction layers, each layer may have a different value for x.

In example embodiments, a solar cell may further include a lens provided above one or more of the first and second heating portions and corresponding to the area where the plurality of $In_xGa_{1-x}N$ p-n junction layers are formed so as to focus sunlight onto the plurality of $In_xGa_{1-x}N$ p-n junction layers.

In example embodiments, the substrate may be made of a glass material. Furthermore, the first and second micro-heaters may be operated independently of each other.

Also disclosed herein is a method for fabricating a higher-efficiency, multi-stacked solar cell by forming a plurality of $In_xGa_{1-x}N$ p-n junction layers on a relatively inexpensive and available substrate (e.g., glass substrate) using a micro-heater array. A method for fabricating a solar cell using a micro-heater array may include applying a first voltage to a micro-heater array in the presence of source and doping gases, the micro-heater array having a first heating portion extending in a first direction and a second heating portion extending in a second direction so as to traverse the first heating portion; and forming a first plurality of $In_xGa_{1-x}N$ p-n junction layers at a juncture of the first and second heating portions, x being a number from 0 to 1 and each of the first plurality of $In_xGa_{1-x}N$ p-n junction layers having a different value for x.

In other example embodiments, a method for fabricating a solar cell using a micro-heater array may include applying a first voltage to a micro-heater array in the presence of source and doping gases, the micro-heater array having first and second heating portions extending in parallel; and forming a first plurality of $In_xGa_{1-x}N$ p-n junction layers on one of the first or second heating portions, x being a number from 0 to 1 and each of the first plurality of $In_xGa_{1-x}N$ p-n junction layers having a different value for x.

In a method for fabricating a solar cell using a micro-heater array according to example embodiments, the micro-heater array may be provided in a chamber. A voltage may be applied to one of the first or second micro-heaters. A source gas and p-type doping gas may be injected into the chamber to grow a p-type $In_xGa_{1-x}N$ layer on the first heating portion or the second heating portion heated by the applied voltage. A source gas and an n-type doping gas may be injected into the chamber to grow an n-type $In_xGa_{1-x}N$ layer on the first heating portion or the second heating portion heated by the applied voltage. The process for growing the p-type $In_xGa_{1-x}N$ layer and the n-type $In_xGa_{1-x}N$ layer may be repeated to obtain a plurality of $In_xGa_{1-x}N$ p-n junction layers, wherein each layer has a different value for x. The p-type $In_xGa_{1-x}N$ layer and the n-type $In_xGa_{1-x}N$ layer may be grown sequentially, such that the p-type $In_xGa_{1-x}N$ layer is grown first and the n-type $In_xGa_{1-x}N$ layer is grown second or vice versa.

BRIEF DESCRIPTION OF THE DRAWINGS

The features and advantages of example embodiments may become more apparent upon review of the attached drawings. The accompanying drawings are merely intended to depict example embodiments and should not be interpreted to limit the scope of the claims.

FIG. 1C is a cross-sectional view along line I-I' of FIG. 1B.

FIG. 6A is a plan view showing a plurality of $In_xGa_{1-x}N$ p-n junction layers formed on the first and second heating portions of FIG. 5A.

Figure 1A:
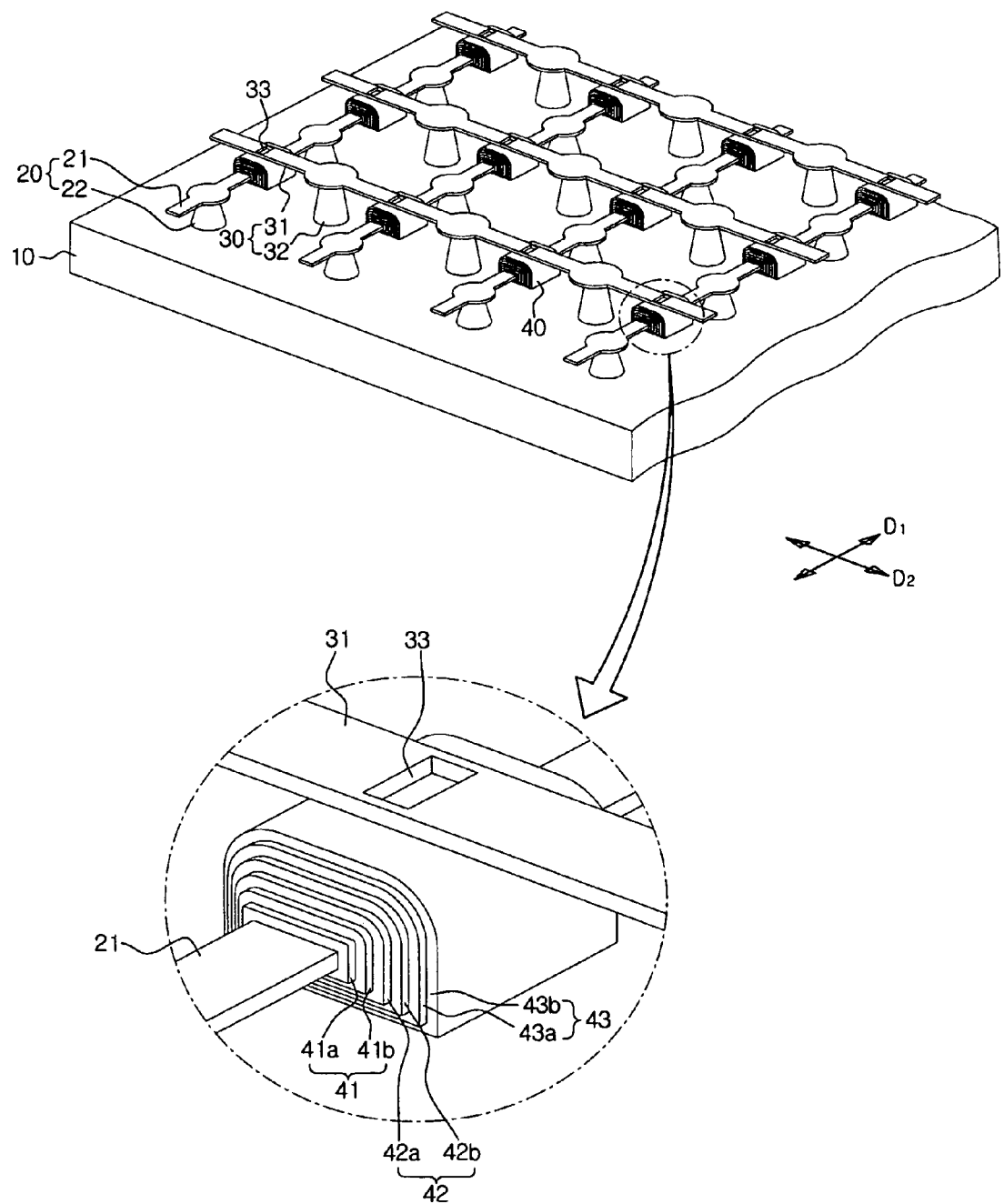
FIG. 1A is a perspective view of a solar cell using a micro-heater array according to an example embodiment.

It should be understood that the appended drawings are not necessarily to scale, while presenting a somewhat simplified representation of various features illustrative of the basic principles of example embodiments. The specific design features of example embodiments as disclosed herein (e.g., specific dimensions, orientations, locations, and shapes) may be determined in part by the particular intended application and use environment.

DETAILED DESCRIPTION

A more detailed description of various example embodiments is provided herein. However, specific structural and functional details disclosed herein are merely representative for purposes of describing example embodiments. Example embodiments may be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the specification.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although a plurality of first and second micro-heaters may be illustrated according to example embodiments as being provided on a substrate, a single (as opposed to a plurality of) first and/or second micro-heater may instead be provided on a substrate.

A solar cell using a micro-heater array according to an example embodiment will be described in detail below. FIG. 1A is a perspective view of a solar cell using a micro-heater array according to an example embodiment, FIG. 1B is a plan view of a solar cell using a micro-heater array according to an example embodiment, and FIG. 1C is a cross-sectional view along line I-I' of FIG. 1B.

Figure 1B:
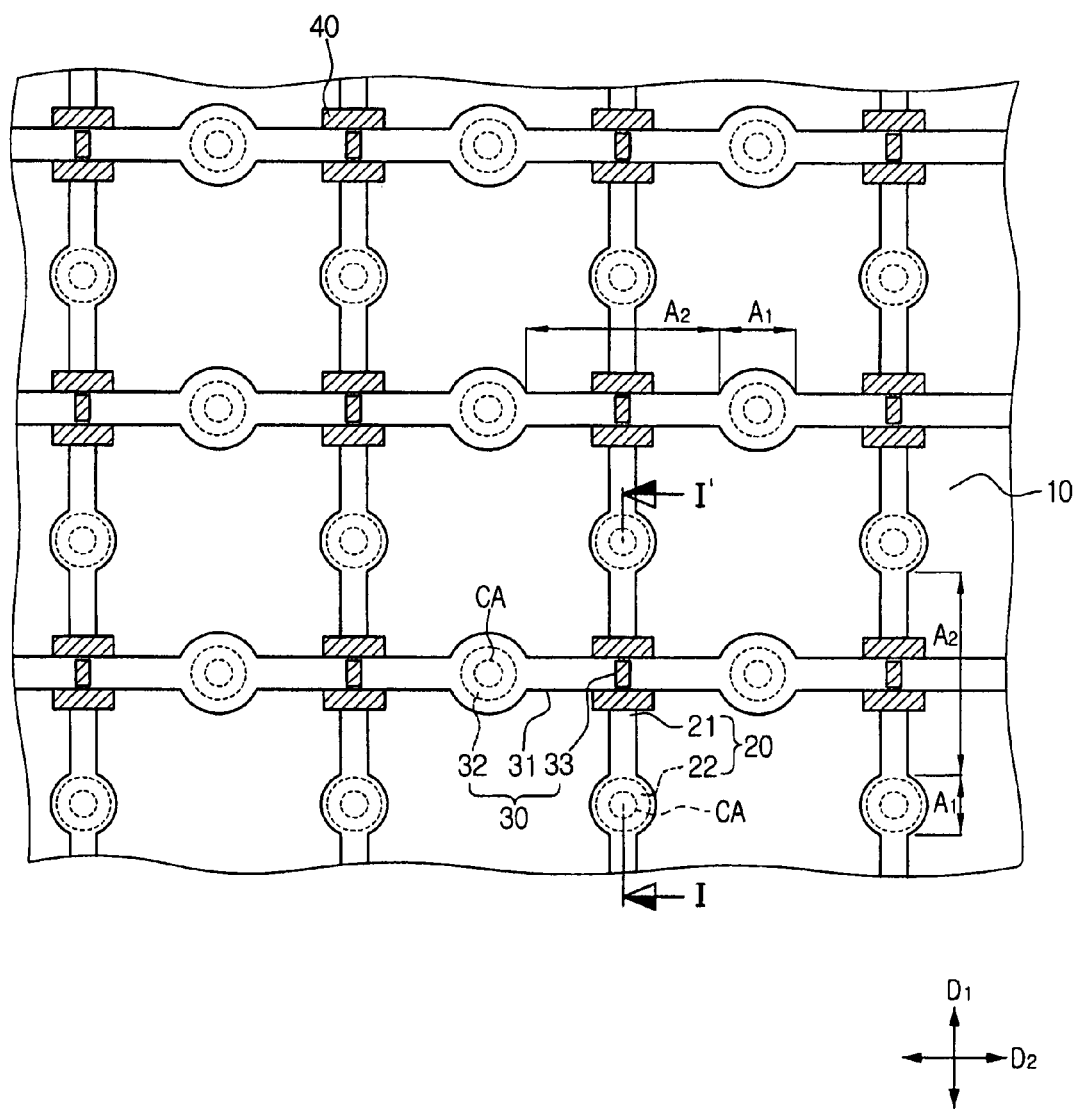
FIG. 1B is a plan view of a solar cell using a micro-heater array according to an example embodiment.

Referring to FIG. 1A through FIG. 1C, a solar cell 101 according to an example embodiment may include a micro-heater array and a plurality of $In_xGa_{1-x}N$ p-n junction layers 40. The micro-heater array may include a substrate 10, a plurality of first micro-heaters 20 arranged in parallel in a first direction D1 on the substrate 10, and a plurality of second micro-heaters 30 provided in a second direction D2 perpendicular to the first direction D1 so as to traverse the plurality of first micro-heaters 20. The plurality of first and second micro-heaters 20, 30 may be operated independently of each other.

Each of the plurality of first micro-heaters 20 may include a first heating portion 21 and first supports 22. The first heating portion 21 may be spaced apart from the substrate 10 and may extend in a first direction D1. The first supports 22 may be provided between the substrate 10 and the first heating portion 21, and support the first heating portion 21.

Each of the plurality of second micro-heaters 30 includes a second heating portion 31 and second supports 32. The second heating portion 31 extends in the second direction D2 perpendicular to the first direction D1, and intersects the first heating portion 21 above the first heating portion 21. The second supports 32 may be provided between the substrate 10 and the second heating portion 31 so as to support the second heating portion 31.

Each of the first and second supports 22, 32 may be arranged so as to be spaced apart from one another along the length direction of the first and second heating portions 21, 31, except for the intersection area of the first and second heating portions 21, 31.

The plurality of $In_xGa_{1-x}N$ p-n junction layers 40 may be formed at one or more of the first and second heating portions 21, 31, at the intersection area of the first and second heating portions 21, 31, by the heat generated from the first or second heating portion 21, 31, and may be electrically connected to the first and second heating portions 21, 31, respectively.

A more detailed description of each constituent is provided below. In this example embodiment, the first and second micro-heaters 20, 30 may be identical in structure and shape. But, the first and second micro-heaters 20, 30 may have different size.

As illustrated in FIG. 1A and FIG. 1C, the second heating portion 31 may be provided above the first heating portion 21, with a predetermined spacing from the first heating portion 21. For the first and second heating portions 21, 31 to be spaced from each other at the intersection/juncture area, the spacing S1 between the first heating portion 21 and the substrate 10 may be smaller than the spacing S2 between the second heating portion 31 and the substrate 10. Therefore, the height of the first supports 22 may be lower than the height of the second supports 32. Meanwhile, the spacing between the first and second heating portions 21, 31 may be the same as the thickness of the plurality of $In_xGa_{1-x}N$ p-n junction layers 40 formed between the first and second heating portions 21, 31, so that the plurality of $In_xGa_{1-x}N$ p-n junction layers 40 may be electrically connected to the first and second heating portions 21, 31, respectively.

The first and second heating portions 21, 31 may be made of a suitable material (e.g., molybdenum, tungsten, silicon carbide) which emit light and generate heat when power is applied. The first and second heating portions 21, 31 may be made of the same material or different materials.

At the intersection area of the first and second heating portions 21, 31, an opening 33 may be formed at the second heating portion 31, or the second heating portion 31 may be formed of a transparent electrode material. As such, the plurality of $In_xGa_{1-x}N$ p-n junction layers 40 formed between the first and second heating portions 21, 31 can absorb light. In this example embodiment, the opening 33 may be formed at the second heating portion 21, so that sunlight from outside can be transmitted to the plurality of $In_xGa_{1-x}N$ p-n junction layers 40 through the opening 33.

The first and second supports 22, 32 may be made of a material having a relatively low thermal conductivity so as to reduce or prevent the loss of heat generated from the first and second heating portions 21, 31. For example, the first and second supports 22, 32 may be made of an insulating material (e.g., $SiO_x$, $Si_3N_4$).

The substrate 10 may be made of a glass material. If the substrate 10 is made of a glass material, the first and second heating portions 21, 31 may be heated to a high temperature of 600-2000° C. while maintaining the temperature of the substrate 10 at, for example, 50° C., because radiation heat (visible ray or IR) is transmitted. Accordingly, the micro-heater array may be used to form a p-n junction requiring heating at high temperature on a glass substrate. This enables the manufacture of large-sized p-n junction devices.

In an example embodiment, as illustrated in FIG. 1B, each of the first and second heating portions 21, 31 may be divided into first areas A1 and second areas A2. The first areas A1 correspond to contact areas CA at which the first and second heating portions 21, 31 are respectively in contact with the first and second supports 22, 32, and each of the second areas A2 may be located between the first areas A1. Here, the area of the contact area CA needs to be decreased as much as possible while the first and second supports 22, 32 maintain supporting of the first and second heating portions 21, 31. The smaller the contact area CA, the less heat is transferred between the first heating portion 21 and the first supports 22 and between the second heating portion 31 and the second supports 32. As a result, power consumption for driving the micro-heater array may be reduced.

Although the first areas A1 and the contact areas CA are shown as circular shapes in FIG. 1A through FIG. 1C, the first areas A1 and the contact areas CA may be etched to have a rectangular shape or another suitable shape.

It may be beneficial for the width of the first areas A1 to be greater than the width of the second areas A2. The reason is that having the width of each of the first areas A1 greater than the width of each of the second areas A2 may facilitate etching of the first and second supports 22, 32, particularly at the contact area CA. Another reason is that when the width of each of the second areas A2 is smaller than the width of each of the first areas A1, more light may be emitted and more heat may be generated at the second areas A2 than at the first areas A1. Such a technical configuration enables the control of light-emission and heat-generation positions.

Each of the first and second heating portions 21, 31 may be divided into the first areas A1 and the second areas A2, the light emission and heat generation may be increased at the second areas A2 but decreased at the first areas A1 respectively supported by the first and second supports 22, 32, and unnecessary power consumption may be reduced by minimizing the heat transfer area at the first areas A1. Accordingly, the applied voltage may be effectively used for high-temperature heating at the second areas A1.

Because the first and second heating portions 21, 31 intersect each other at the second areas A2, a plurality of $In_xGa_{1-x}N$ p-n junction layers 40 may be formed between the first and second heating portions 21, 31, at the intersection area, using the high-temperature heat generated there.

As illustrated in FIG. 1A through FIG. 1C, the first micro-heater 20 may be operated to generate heat at the first heating portion 21 and form the plurality of $In_xGa_{1-x}N$ p-n junction layers 40 at the first heating portion 21 using the heat. Alternatively, the second micro-heater 30 may be operated to form the plurality of $In_xGa_{1-x}N$ p-n junction layers 40 at the second heating portion 31. Further, the first micro-heater 20 and the second micro-heater 30 may be operated sequentially to form the plurality of $In_xGa_{1-x}N$ p-n junction layers 40 at both the first heating portion 21 and the second heating portion 31. Further, because each of the first heating portions 21 and the second heating portions 31 included in the plurality of first and second micro-heaters 20, 30 may be operated independently, it is possible to form the plurality of $In_xGa_{1-x}N$ p-n junction layers 40 only at some points selected from the intersection areas of the first and second heating portions 21, 31.

The plurality of $In_xGa_{1-x}N$ p-n junction layers 40 may be formed on the first heating portion 21. Because relatively localized high temperature heating is possible at the second area A2 of the first heating portion 21, the plurality of $In_xGa_{1-x}N$ p-n junction layers 40 may be formed at the second area A2 of the first heating portion 21.

As illustrated in FIG. 1A and FIG. 1C, the plurality of $In_xGa_{1-x}N$ p-n junction layers 40 have a multilayer structure. Each of the plurality of $In_xGa_{1-x}N$ p-n junction layers 40 may include a p-type $In_xGa_{1-x}N$ layer and an n-type $In_xGa_{1-x}N$ layer. And, in the plurality of $In_xGa_{1-x}N$ p-n junction layers 40, each x may have a different value in the range from 0 to 1.

The plurality of $In_xGa_{1-x}N$ p-n junction layers 40 may include three $In_xGa_{1-x}N$ p-n junction layers 41, 42, 43. The first $In_xGa_{1-x}N$ p-n junction layer 41 may include a first p-type $In_xGa_{1-x}N$ layer 41a and a first n-type $In_xGa_{1-x}N$ layer 41b, the second $In_xGa_{1-x}N$ p-n junction layer 42 may include a second p-type $In_xGa_{1-x}N$ layer 42a and a second n-type $In_xGa_{1-x}N$ layer 42b, and the third $In_xGa_{1-x}N$ p-n junction layer 43 may include a third p-type $In_xGa_{1-x}N$ layer 43a and a third n-type $In_xGa_{1-x}N$ layer 43b.

The p-type $In_xGa_{1-x}N$ layer and the n-type $In_xGa_{1-x}N$ layer may be formed sequentially to form the plurality of $In_xGa_{1-x}N$ p-n junction layers 40. However, the n-type $In_xGa_{1-x}N$ layer and the p-type $In_xGa_{1-x}N$ layer may be formed sequentially to form the plurality of $In_xGa_{1-x}N$ p-n junction layers 40.

In the plurality of $In_xGa_{1-x}N$ p-n junction layers 40, each x may be adjusted to have different value so as to effectively absorb sunlight incident on the plurality of $In_xGa_{1-x}N$ p-n junction layers 40. Because each host material $In_xGa_{1-x}N$ included in the plurality of $In_xGa_{1-x}N$ p-n junction layers 40 forms a solid solution of In and Ga, the x value may be controlled between 0 and 1 by varying the contents of In and Ga, and, the band gap ($E_g$) of the x value.

By laminating $In_xGa_{1-x}N$ p-n junction layers having different x values, a plurality of $In_xGa_{1-x}N$ p-n junction layers 40 with different $E_g$ values may be formed, and each of the plurality of $In_xGa_{1-x}N$ p-n junction layers 40 may absorb sunlight with different wavelength. Depending on the x value, the $E_g$ of the $In_xGa_{1-x}N$ may be varied from 0.7 eV (590 nm) to 3.4 eV (120 nm). This almost corresponds to the spectrum of sunlight, which has a wide wavelength ranges. Therefore, of the sunlight incident on the plurality of $In_xGa_{1-x}N$ p-n junction layers 40, the light with a short wavelength may be absorbed by an $In_xGa_{1-x}N$ p-n junction layer with large $E_g$, and the light with a long wavelength may be absorbed by an $In_xGa_{1-x}N$ p-n junction layer with small $E_g$. Consequently, the loss of the sunlight incident on the plurality of $In_xGa_{1-x}N$ p-n junction layers 40 may be prevented. As a result, the efficiency of the solar cell 101 may be improved. For instance, a solar cell having two $In_xGa_{1-x}N$ p-n junction layers 40 has a maximum efficiency of about 50%. The maximum efficiency can be increased to about 56% with a solar cell having three layers, and to about 72% with a solar cell having 36 layers.

If the x value in $In_xGa_{1-x}N$ is 0, the $In_xGa_{1-x}N$ p-n junction layer has an $E_g$ of 3.4 eV. If the x value in $In_xGa_{1-x}N$ is 0.4, the $In_xGa_{1-x}N$ p-n junction layer has an $E_g$ of 1.0 eV. And, if the x value in $In_xGa_{1-x}N$ is 1, the $In_xGa_{1-x}N$ p-n junction layer has an $E_g$ of 0.7 eV. Thus, as the x value of the $In_xGa_{1-x}N$ increases, the $In_xGa_{1-x}N$ p-n junction layer has a smaller $E_g$. Of the plurality of $In_xGa_{1-x}N$ p-n junction layers 40, the $In_xGa_{1-x}N$ p-n junction layer with a smaller x value absorbs shorter wavelengths of sunlight. And, of the plurality of $In_xGa_{1-x}N$ p-n junction layers 40, the $In_xGa_{1-x}N$ p-n junction layer with a larger x value absorbs longer wavelengths of sunlight.

Accordingly, by forming the plurality of $In_xGa_{1-x}N$ p-n junction layers 40 at the side where sunlight is incident such that the $In_xGa_{1-x}N$ p-n junction layers are aligned from one having a larger $E_g$ to one having a smaller $E_g$, it may be configured such that the plurality of $In_xGa_{1-x}N$ p-n junction layers 40 can sequentially absorb the shorter to longer wavelengths of sunlight.

For instance, if the plurality of $In_xGa_{1-x}N$ p-n junction layers 40 includes the three $In_xGa_{1-x}N$ p-n junction layers 41, 42, 43 as illustrated in FIG. 1C, the third $In_xGa_{1-x}N$ p-n junction layer 43, which corresponds to the outermost layer closest to the incident sunlight and contacts the second heating portion 31, may have a x value of 0, the second (or intermediate) $In_xGa_{1-x}N$ p-n junction layer 42 may have a x value of 0.4, and the first $In_xGa_{1-x}N$ p-n junction layer 41, which corresponds to the innermost layer and contacts the first heating portion 21, may have a x value of 1. In this case, sunlight may be absorbed from one with a shorter wavelength to one with a longer wavelength, as it passes from the third $In_xGa_{1-x}N$ p-n junction layer 43 to the first $In_xGa_{1-x}N$ p-n junction layer 41.

Because the plurality of $In_xGa_{1-x}N$ p-n junction layers 40 are directly grown on the first heating portion 21 by the heat generated from the first heating portion 21 and are electrically connected to the first and second heating portions 21, 31, respectively, the first and second heating portions 21, 31 may be used as two electrodes of the solar cell 101 after the plurality of $In_xGa_{1-x}N$ p-n junction layers 40 have been formed. Accordingly, the solar cell 101 may be made relatively thin and light because no additional electrode layer is required.

The plurality of $In_xGa_{1-x}N$ p-n junction layers 40 may be formed by the metal organic chemical vapor deposition (MOCVD) method. TMIn, TEGa, and $NH_3$ may be used as sources of In, Ga, and N for forming the host $In_xGa_{1-x}N$, respectively. $Cp_2Mg$ may be used as a p-type doping gas, and $SiH_4$ may be used as an n-type doping gas.

To grow $In_xGa_{1-x}N$, a growth temperature of about 1000° C. or higher may be required. Because of the high-temperature heating requirement, only expensive substrates such as silicon wafer, $Al_2O_3$ substrate, SiC substrate, etc. could be used, and there were limitations in manufacturing large-sized solar cells. However, if $In_xGa_{1-x}N$ is grown using a microheater array, relatively high-temperature heating is possible while maintaining the temperature of a glass substrate at or around room temperature. As a result, $In_xGa_{1-x}N$ p-n junction layers may be formed on a glass substrate, and the manufacture of large-sized solar cells becomes possible.

The plurality of $In_xGa_{1-x}N$ p-n junction layers 40 may be formed symmetrically on the top and bottom surfaces of the first heating portion 21. However, the plurality of $In_xGa_{1-x}N$ p-n junction layers 40 may be formed only on the top surface of the first heating portion 21.

Figure 2:
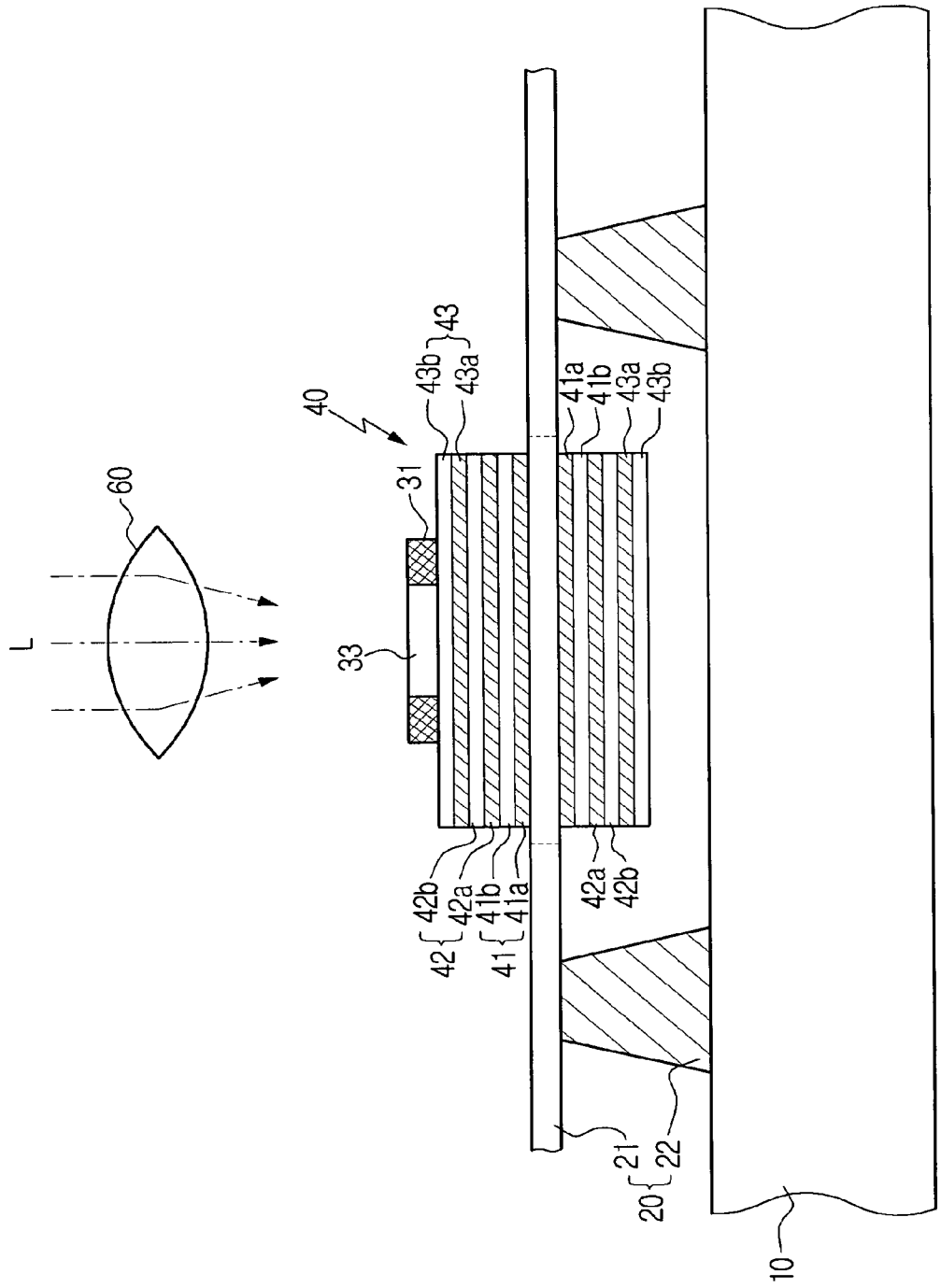
FIG. 2 is a cross-sectional view of a solar cell using a micro-heater array according to another example embodiment.

FIG. 2 is a cross-sectional view showing another aspect of a solar cell using a micro-heater array according to an example embodiment. Of the components illustrated in FIG. 2, the components the same as those illustrated in FIG. 1C are designated by the same reference numerals, and detailed descriptions thereof will be omitted.

A solar cell 101 may further include a lens provided above one or more of the first and second heating portions 21, 31, corresponding to the area where the plurality of $In_xGa_{1-x}N$ p-n junction layers 40 are formed, so as to focus sunlight L onto the plurality of $In_xGa_{1-x}N$ p-n junction layers 40.

As illustrated in FIG. 2, in an example embodiment, the solar cell 101 may further include a lens 60 provided above the second heating portion 31. The lens 60 may be provided individually at the intersection area of the first and second heating portions 21, 31, in the form of an array corresponding to the areas where the plurality of In$_x$Ga$_{1-x}$N p-n junction layers 40 are formed as in FIG. 1A. The lenses may be a cylinder-shape or semicylinder-shape lenses, and may be aligned along the length direction of the first heating portion 21 or the second heating portion 31, corresponding to the areas where the plurality of In$_x$Ga$_{1-x}$N p-n junction layers 40 are formed.

Figure 3A:
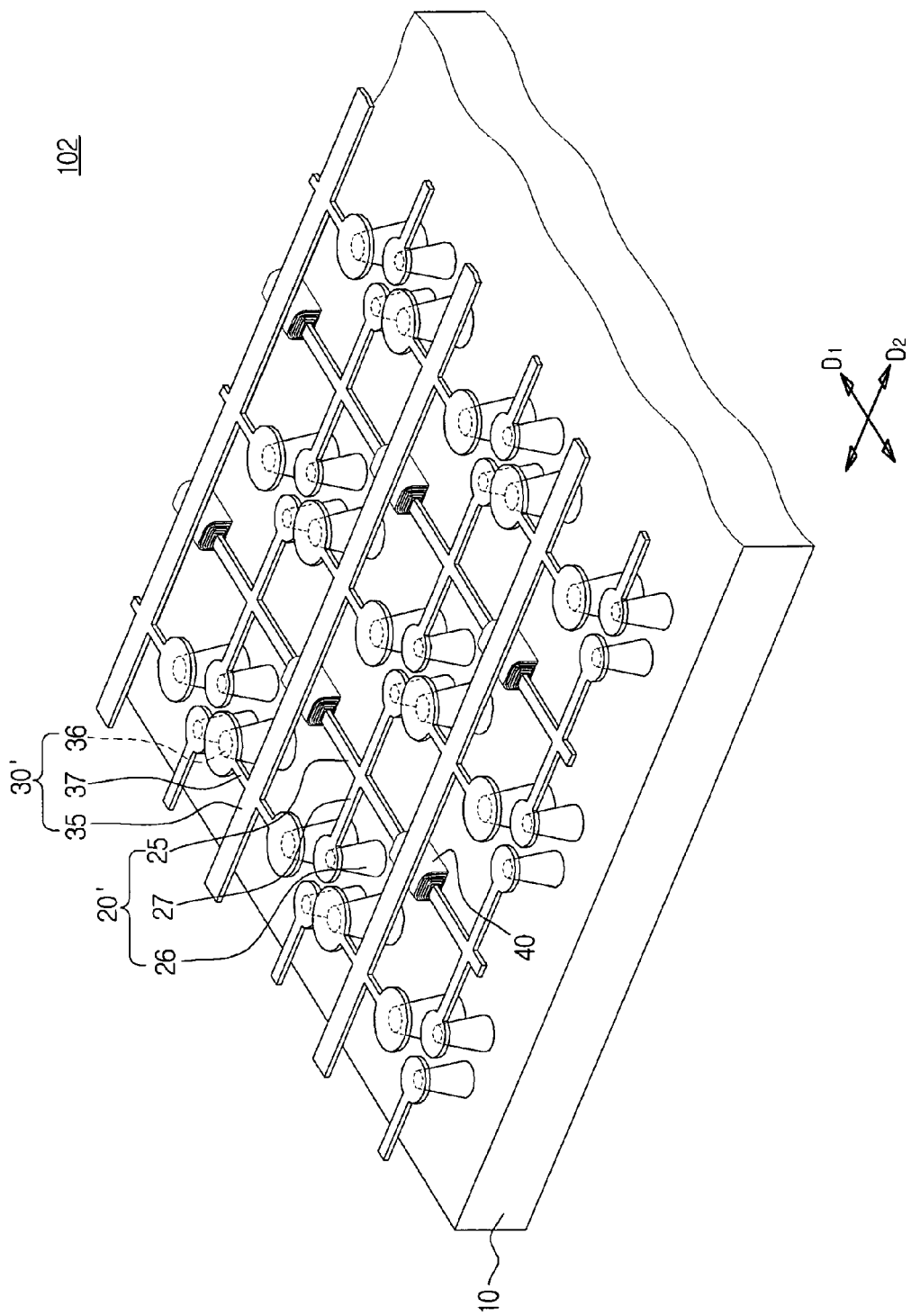
FIGS. 3A and 3B are perspective and plan views, respectively, of a solar cell using a micro-heater array according to another example embodiment.
Figure 3B:
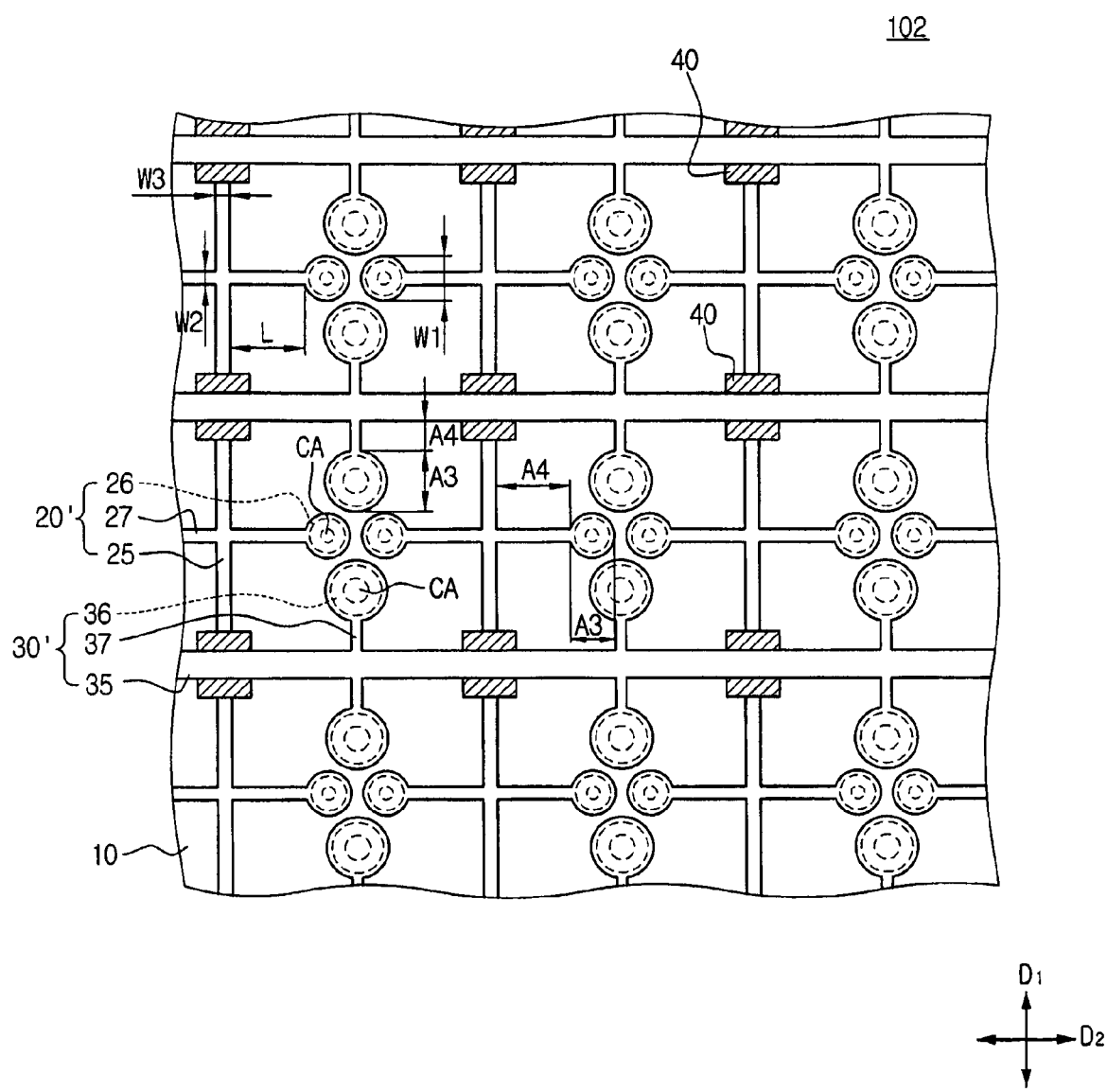

FIG. 3A and FIG. 3B are drawings of a solar cell using a micro-heater array according to another example embodiment. Of the components illustrated in FIG. 3A and FIG. 3B, the components the same as those illustrated in FIG. 1A through FIG. 1C are designated by the same reference numerals, and detailed descriptions thereof will be omitted.

Referring to FIG. 3A and FIG. 3B, a solar cell 102 using a micro-heater array according to another example embodiment may include a micro-heater array and a plurality of In$_x$Ga$_{1-x}$N p-n junction layers 40.

Each of a plurality of first and second micro-heaters 20', 30' may further include first and second connecting portions 27, 37. The construction of the micro-heater array and the plurality of In$_x$Ga$_{1-x}$N p-n junction layers 40 according to this embodiment may be the same as that of the micro-heater array and the plurality of In$_x$Ga$_{1-x}$N p-n junction layers illustrated in FIG. 1A through FIG. 1C, except that the first and second supports 26, 36 are not provided below the first and second heating portions 25, 35 but below the first and second connecting portions 27, 37.

Each of the plurality of first micro-heaters 20' may include a first heating portion 25, first supports 26 and first connecting portions 27. The first heating portion 25 may be spaced apart from the substrate 10 and extends along the first direction D1. The first connecting portions 27 extend from both sides of the first heating portion 25 respectively, and are arranged along the length direction of the first heating portion 25 while being spaced from each other. The first supports 26 are provided between the substrate 10 and the first connecting portions 27, and support the first heating portion 25 and the first connecting portions 27.

Each of the plurality of second micro-heaters 30' may include a second heating portion 35, second supports 36 and second connecting portions 37. The second heating portion 35 may be spaced apart from the substrate 10 and extends along the second direction D2 perpendicular to the first direction D1 so as to intersect the first heating portion 25 above the first heating portion 25. The second connecting portions 37 may extend from both sides of the second heating portion 35 respectively, and may be arranged along the length direction of the second heating portion 35 while being spaced from each other. The second supports 36 may be provided between the substrate 10 and the second connecting portions 37, and support the second heating portion 35 and the second connecting portions 37.

At the intersection area of the first and second heating portions 25, 35, the height of the first supports 26 may be smaller than the height of the second supports 36, so that the first and second heating portions 25, 35 may be spaced apart by a predetermined distance. Each of the first and second heating portions 25, 35 emits light and generates heat by the application of voltage, and may be operated independently.

The second heating portion 35 may be formed of a transparent electrode material, so that sunlight can be transmitted to the plurality of In$_x$Ga$_{1-x}$N p-n junction layers 40 provided below the second heating portion 35.

The construction and shape of the plurality of second micro-heaters 30' may be the same as those of the plurality of first micro-heaters 20', except that they may be provided above substrate 10 in the direction perpendicular to that of the plurality of first micro-heaters 20'. Hereinafter, the structure of the plurality of first micro-heaters 20' will be described in detail.

As illustrated in FIG. 3A and FIG. 3B, the first connecting portions 27 may be provided on both sides of the first heating portion 25, except for the intersection area of the first and second heating portions 25, 35. In this example embodiment, the first connecting portions 27 extend along the direction D2 perpendicular to the length direction D1 of the first heating portion 25, and may be provided symmetrically on both sides of the first heating portion 25. However, the first connecting portions 27 may be provided asymmetrically on both sides of the first heating portion 25. The first connecting portions 27 may be formed of the same material as the first heating portion 25, and formed integrally with the first heating portion 25 for the following processes.

The first supports 26 may be partially provided below the first connecting portions 27, and partially contact the first connecting portions 27. Here, each of the first connecting portions 27 may be divided into a third region A3 and a fourth region A4. The third region A3 corresponds to a contact area CA where the first connecting portions 27 contact the first supports 26. The fourth region A4 may be between the first heating portion 25 and the third region A3. In this example embodiment, the first supports 26 may be provided below each end portion of the first connecting portions 27.

Because the first connecting portions 27 are supported by the first supports 26, the first heating portion 25 formed integrally with the first connecting portions 27 can be supported by the first supports 26 without contacting the first supports 26. Further, because the first heating portion 25 and the first supports 26 are spaced apart from each other by the first connecting portions 27, the shape of the first supports 26 has no effect on the temperature distribution of the first heating portion 25. Hence, the first heating portion 25 can maintain a uniform temperature distribution.

In the first micro-heater 20', by reducing the areas where heat transfer occurs between the first heating portion 25 and the first connecting portions 27 and between the first connecting portions 27 and the first supports 26 (e.g., within the range where the supporting is maintained), power consumption for driving the first micro-heater 20' may be decreased.

Specifically, the thermal conductivity from both sides of the first heating portion 25 to each of the first connecting portions 27 decreases as the length L of the fourth area A4 of the first connecting portions 27 increases and as the width W1, W2 of the first connecting portions 27 decreases. Further, the thermal conductivity from the first connecting portions 27 to the first supports 26 decreases as the width of the contact area CA decreases.

Accordingly, heat loss at the first heating portion 25 may be reduced by maximizing the length L of the fourth area A4 of the first connecting portions 27 or by minimizing the width W1, W2 of the first connecting portions 27 and the contact area CA, within the range where the supporting of the first heating portion 25 is maintained. As a result, unnecessary power consumption by the first micro-heater 20' may be reduced, and the applied voltage may be effectively used for high-temperature heating of the first heating portion 25.

For example, as illustrated in FIG. 3B, the width W2 of the fourth area A4 of the first connecting portions 27 may be set smaller than the width W3 of the first heating portion 25 in order to reduce heat transfer from the first heating portion 25 to the fourth region A4 of the first connecting portions 27. Further, in order to reduce heat transfer from the first connecting portions 27 to the first supports 26, the width of the contact area CA may be set smaller than the width W1 of the third area.

If the area of the contact area CA and the third area A3 of the first connecting portions 27 is too small, a structural stability may not be secured because the supporting by the first supports 26 may be difficult. Accordingly, the area of the contact area CA and the third region A3 may be large enough to ensure the supporting of the first heating portion 25 and the first connecting portions 27 by the first supports 26. Consequently, as illustrated in FIG. 3B, the width W1 of the third region A3 and the width of the contact area CA may be set larger than the width W2 of the fourth region A4.

Similarly, as for the second micro-heater 30', power consumption for the driving of the second micro-heaters 30' may be reduced by adjusting the size of the area where heat transfer occurs between the second heating portion 35 and the second connecting portions 37 and between the second connecting portions 37 and the second supports 36.

Although the third area A3 and the contact area CA are shown in a circular shape in FIG. 3A and FIG. 3B, the third region A3 or the contact area CA may be etched to have a rectangular shape or another shape.

Each of the plurality of $In_xGa_{1-x}N$ p-n junction layers 40 may be directly grown on the first heating portion 25, at the intersection area of the first and second heating portions 25, 35, using the heat generated from the first heating portion 25, and may be electrically connected to the first and second heating portions 25, 35, respectively. Because each of the plurality of $In_xGa_{1-x}N$ p-n junction layers 40 has different x value, sunlight with various wavelengths may be effectively absorbed.

Figure 4A:
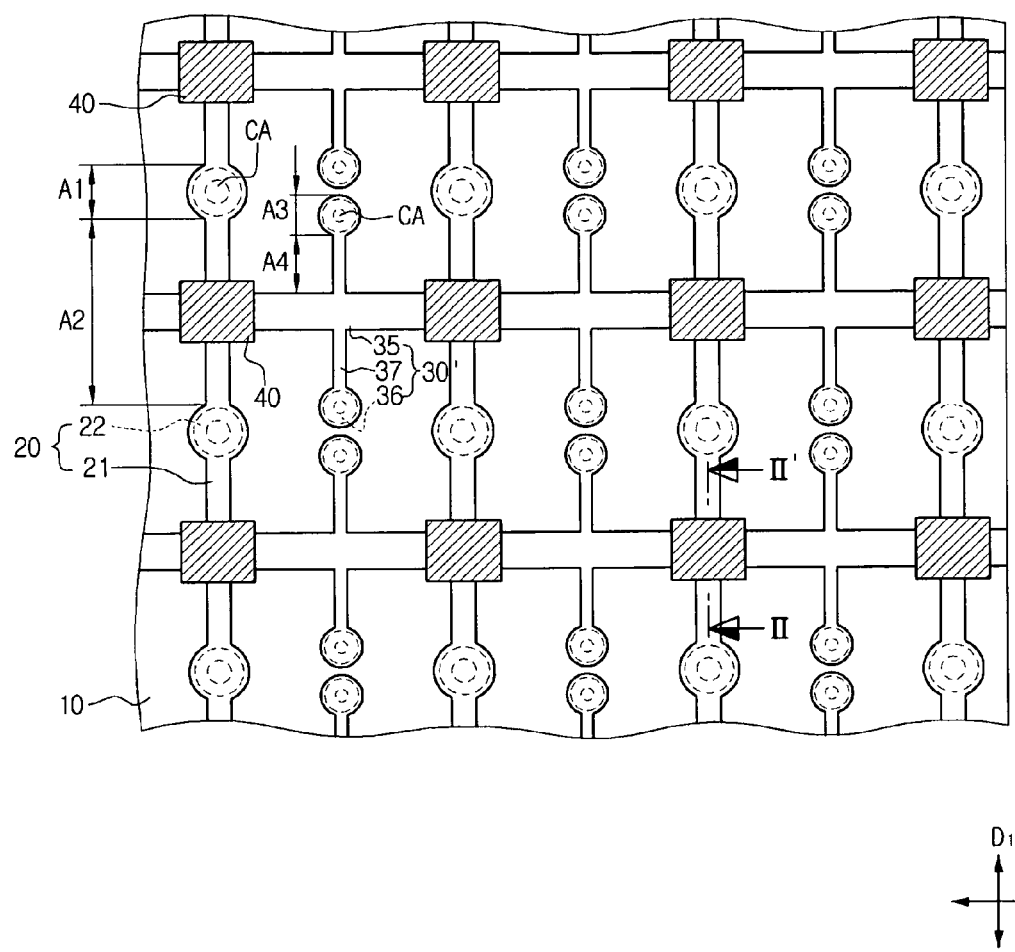
FIG. 4A is a plan view of a solar cell using a micro-heater array according to another example embodiment.
Figure 4B:
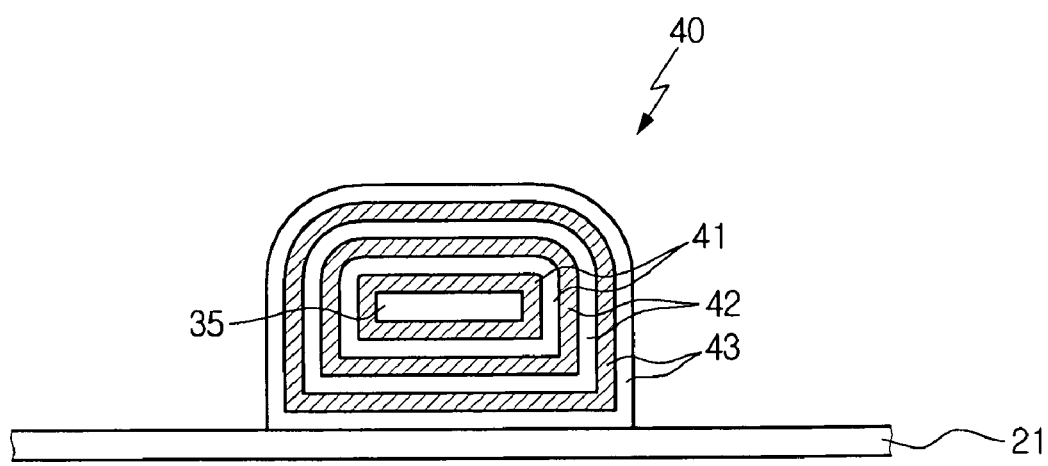
FIG. 4B is a cross-sectional view along line II-II' of FIG. 4A.
Figure 4B:
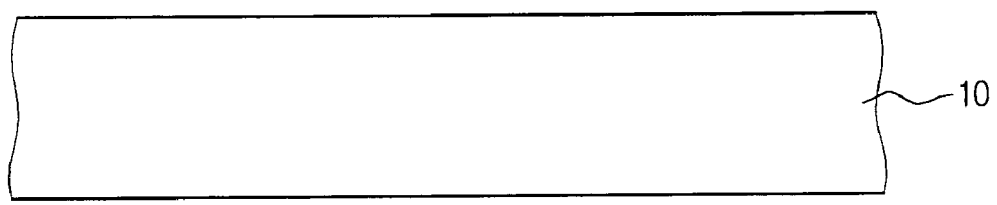

FIG. 4A is a plan view of a solar cell using a micro-heater array according to still another example embodiment, and FIG. 4B is a cross-sectional view along line II-II' in FIG. 4A. Of the components illustrated in FIG. 4A and FIG. 4B, the components the same as those illustrated in FIG. 1A through FIG. 1C are designated by the same reference numerals, and detailed descriptions thereof will be omitted.

A solar cell 103 using a micro-heater array according to still another example embodiment may include a micro-heater array and a plurality of $In_xGa_{1-x}N$ p-n junction layers 40.

In this example embodiment, each of the plurality of first micro-heaters 20 may include a first heating portion 21 and first supports 22. The first heating portion 21 may be spaced apart from the substrate 10 and extends in a first direction D1. The first supports 22 may be provided partially between the substrate 10 and the first heating portion 21 and support the first heating portion 21.

Each of the plurality of second micro-heaters 30' may include a second heating portion 35, second supports 36 and second connecting portions 37. The second heating portion 35 may be spaced apart from the substrate 10 and extends in a second direction D2 perpendicular the first direction D1 to intersect the first heating portion 21 above first heating portion 21. The second connecting portions 37 may extend from both sides of the second heating portion 35 respectively, and arranged along the length direction of the second heating portion 35 while being spaced apart from each other. The second supports 36 may be provided between the substrate 10 and the second connecting portions 37, and support the second heating portion 35 and the second connecting portions 37.

At the intersection area of the first and second heating portions 21, 35, the height of the first supports 22 may be lower than the height of the second supports 36, so that the first and second heating portions 21, 35 may be spaced apart by a predetermined distance. Each of the first and second heating portions 21, 35 emits light and generates heat by the applied voltage, and may be operated independently. The second heating portion 35 may be formed of a transparent electrode material.

As illustrated in FIG. 4A and FIG. 4B, the plurality of $In_xGa_{1-x}N$ p-n junction layers 40 may be formed on the second heating portion 35 using the heat generated from the second heating portion 35, and are electrically connected to the first and second heating portions 25, 35, respectively. Because the plurality of $In_xGa_{1-x}N$ p-n junction layers 40 may include three $In_xGa_{1-x}N$ p-n junction layers 41, 42, 43 with different x values, sunlight with various wavelengths may be effectively absorbed.

Figure 5A:
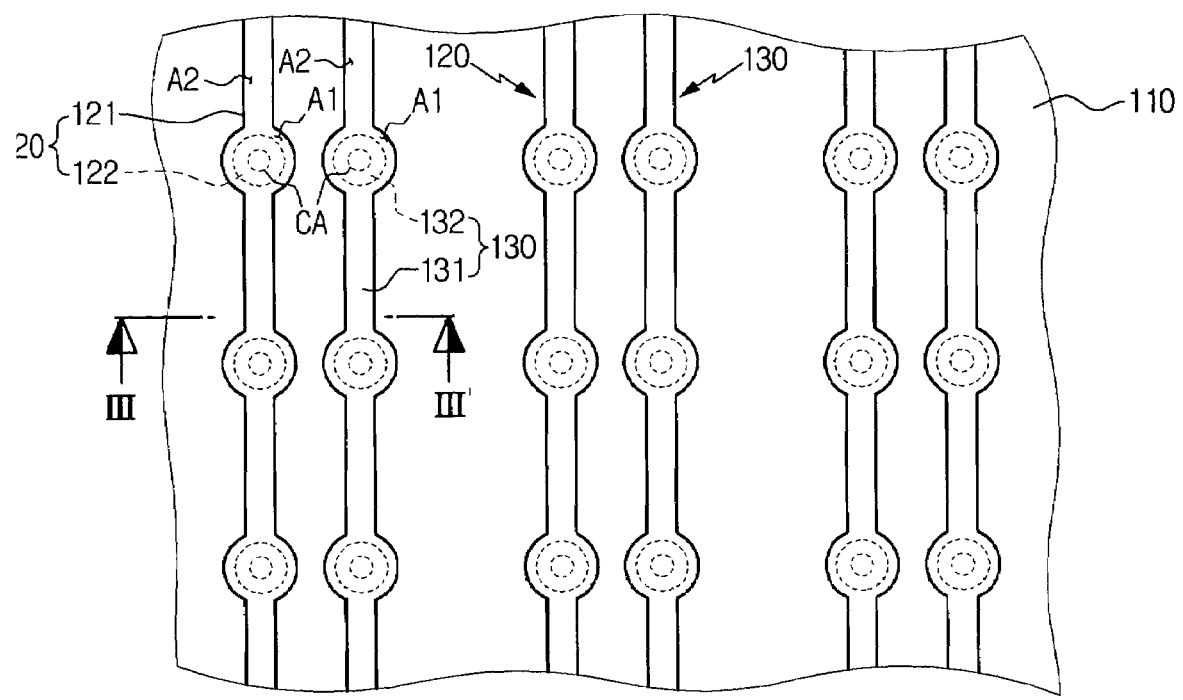
FIG. 5A is a plan view of a solar cell using a micro-heater array according to another example embodiment.
Figure 5B:
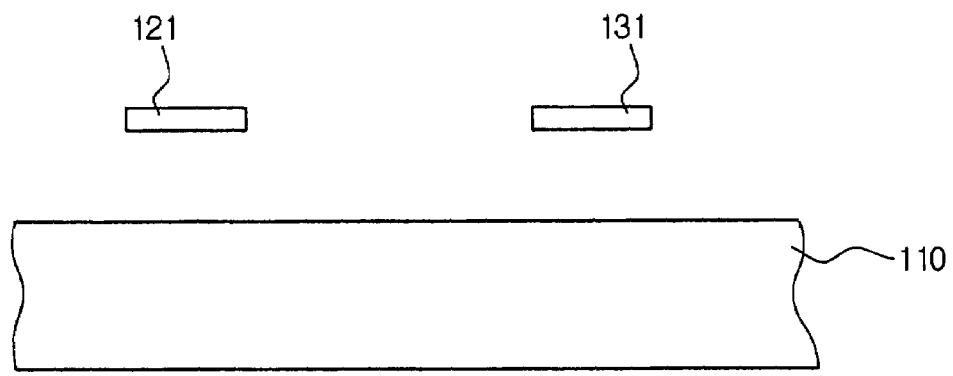
FIG. 5B is a cross-sectional view along line III-III' of FIG. 5A.
Figure 6B:
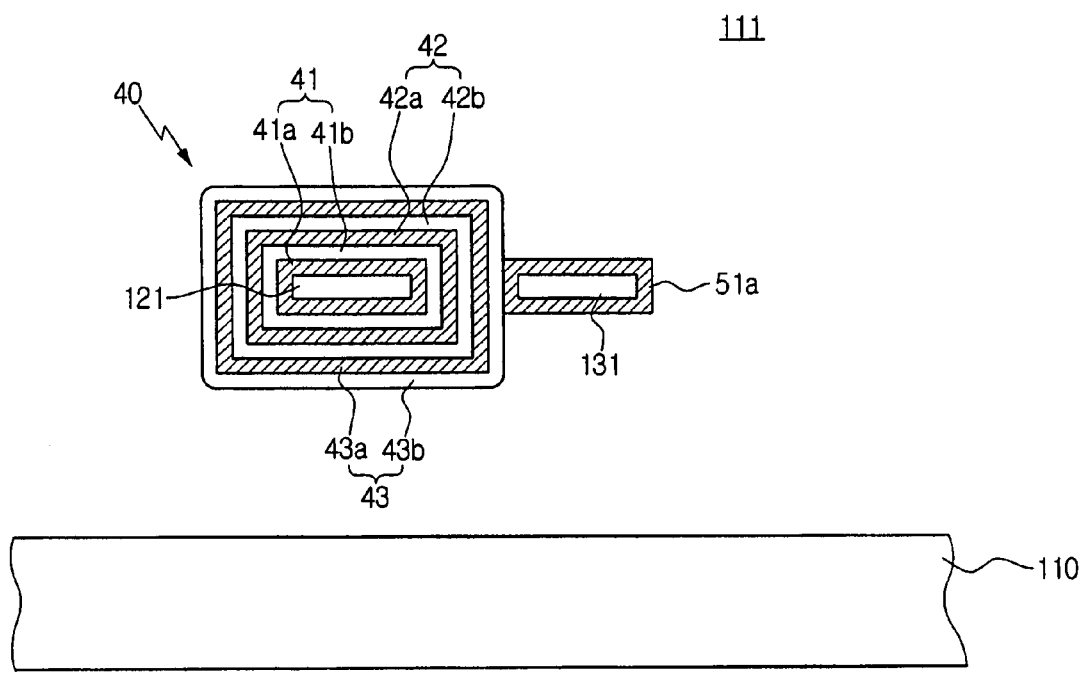
FIG. 6B is a cross-sectional view along line IV-IV' of FIG. 6A.

FIG. 5A through FIG. 6B are drawings for illustrating a solar cell using a micro-heater array according to further another example embodiment. FIG. 5A is a plan view of a solar cell using a micro-heater array according to another example embodiment, FIG. 5B is a cross-sectional view along line III-III' in FIG. 5A, FIG. 6A is a plan view showing a plurality of $In_xGa_{1-x}N$ p-n junction layers formed at the first and second heating portions of FIG. 5A, and FIG. 6B is a cross-sectional view along line IV-IV' in FIG. 6A.

Referring to FIG. 5A and FIG. 5B, the micro-heater array according to this example embodiment may include a substrate 110, and a plurality of first micro-heaters 120 and second micro-heaters 130 aligned in an alternating manner above the substrate 110 so as to be parallel with each other.

Each of the plurality of first micro-heaters 120 may include a first heating portion 121 and first supports 122. The first heating portion 121 may be spaced apart from the substrate 110 and extends in a first direction. The first supports 122 may be provided partially between the substrate 110 and the first heating portion 121, and support the first heating portion 121.

Like the first micro-heaters 120, each of the plurality of second micro-heaters 130 include a second heating portion 131 and second supports 132. The second heating portion 131 may be spaced apart from the substrate 110 and may be aligned in parallel to the first heating portion 121. The second supports 132 may be provided partially between the substrate 110 and the second heating portion 131, and support the second heating portion 131.

Each of the first and second heating portions 121, 131 may be divided into first areas A1 and second areas A2. The first areas A1 correspond to contact areas CA at which the first and second heating portions 121, 131 are respectively in contact with the first and second supports 122, 132, and each of the second areas A2 may be located between the first areas A1. In the first and second heating portions 121, 131, relatively high-temperature heating is possible at the second areas A2 rather than the first areas A1.

As illustrated in FIG. 5A and FIG. 5B, the first micro-heaters 120 and the second micro-heaters 130 may be aligned in parallel, so that the first areas A1 and the second areas A2 of the first heating portions 121 may be relatively close to the first areas A1 and the second areas A2 of the second heating portions 131.

The first and second micro-heaters 120, 130 according to this example embodiment have the same shape and structure as those of the first micro-heaters 20 illustrated in FIG. 1A and FIG. 1B. Therefore, detailed description of the first and second micro-heaters 120, 130 according to this example embodiment will be omitted.

Referring to FIG. 6A and FIG. 6B, the plurality of $In_xGa_{1-x}N$ p-n junction layers 40 may be formed on the first heating portion 121 using the heat generated from the first heating portion 121, and may be electrically connected to the first and second heating portions 121, 131, respectively. Because the plurality of $In_xGa_{1-x}N$ p-n junction layers 40 may include three $In_xGa_{1-x}N$ p-n junction layers 41, 42, 43 with different x values, sunlight with various wavelengths may be effectively absorbed.

The plurality of $In_xGa_{1-x}N$ p-n junction layers 40 may contact the p-type $In_xGa_{1-x}N$ layer 51a formed on the second heating portion 131, and may be electrically connected with the second heating portion 131. Of the plurality of $In_xGa_{1-x}N$ p-n junction layers 40, the n-type $In_xGa_{1-x}N$ layer 43b of the third, i.e., the outermost, $In_xGa_{1-x}N$ p-n junction layer 43 contacts the p-type $In_xGa_{1-x}N$ layer 51a formed on the second heating portion 131.

If the outermost layer of the plurality of $In_xGa_{1-x}N$ p-n junction layers formed on the first heating portion 121 is a p-type $In_xGa_{1-x}N$ layer, an n-type $In_xGa_{1-x}N$ layer may be formed on the second heating portion 131 and contacted with the plurality of $In_xGa_{1-x}N$ p-n junction layer.

The construction of the plurality of $In_xGa_{1-x}N$ p-n junction layers 40 may be the same as that of the plurality of $In_xGa_{1-x}N$ p-n junction layers described referring to FIG. 1A through FIG. 1C. Therefore, detailed description thereof will be omitted.

Although not illustrated in the drawings, the solar cell 111 according to this example embodiment may further include a lens which is provided above the first heating portion 121, corresponding to the area where the plurality of $In_xGa_{1-x}N$ p-n junction layers 40 are formed, and focuses sunlight from outside.

Figure 6C:
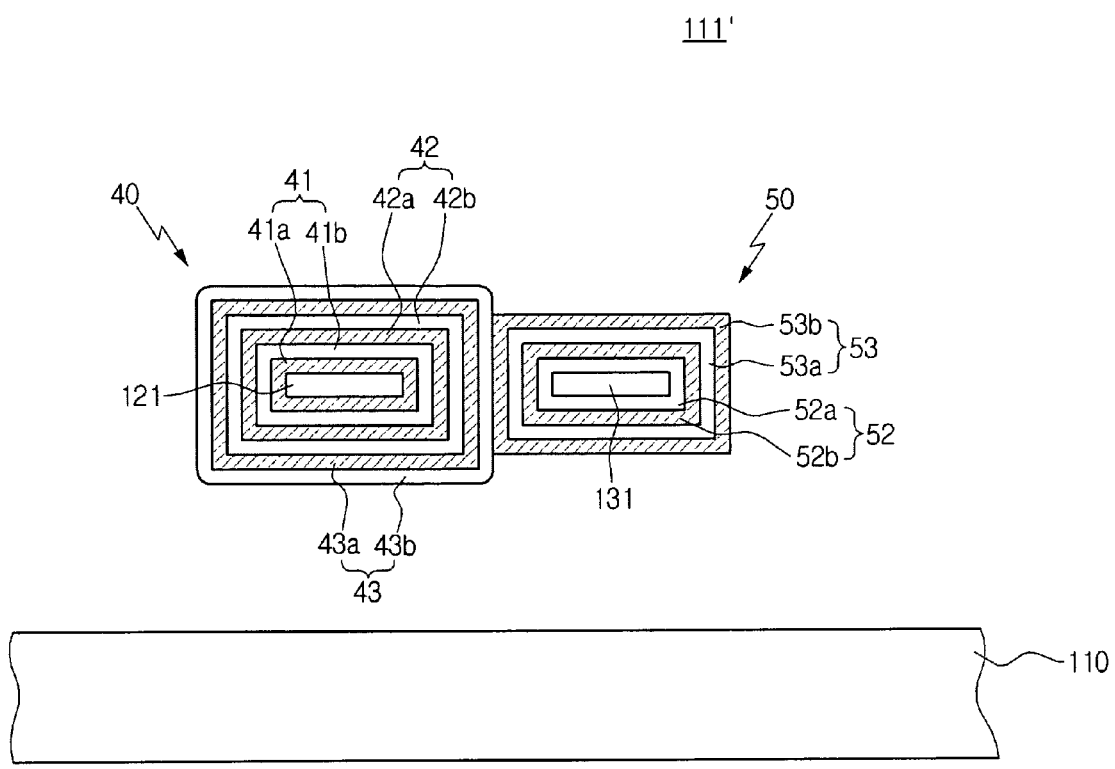
FIG. 6C is a cross-sectional view of a solar cell using the micro-heater array illustrated in FIGS. 5A and 5B according to another example embodiment.

FIG. 6C is a cross-sectional view of the solar cell using a micro-heater array illustrated in FIG. 5A and FIG. 5B according to another example embodiment. Of the components illustrated in FIG. 6C, the components the same as those illustrated in FIG. 6A and FIG. 6B are designated by the same reference numerals, and detailed descriptions thereof will be omitted.

As illustrated in FIG. 6C, a solar cell 111' according to another example embodiment may further include a plurality of $In_xGa_{1-x}N$ p-n junction layers 50 formed on a second heating portion 131 using the heat generated from the second heating portion 131. In this example embodiment, the plurality of $In_xGa_{1-x}N$ p-n junction layers 50 formed on the second heating portion 131 may include two (first and second) $In_xGa_{1-x}N$ p-n junction layers 52, 53. In this case, the outermost layer of the plurality of $In_xGa_{1-x}N$ p-n junction layers 40 formed on the first heating portion 121, which is the third n-type $In_xGa_{1-x}N$ layer 43b, contacts the outermost layer of the plurality of $In_xGa_{1-x}N$ p-n junction layers 50 formed on the second heating portion 131, i.e., a p-type $In_xGa_{1-x}N$ layer 53b. Accordingly, the plurality of $In_xGa_{1-x}N$ p-n junction layers 50 formed on the second heating portion 131 has a structure in which a first n-type $In_xGa_{1-x}N$ layer 52a, a first p-type $In_xGa_{1-x}N$ layer 52b, a second n-type $In_xGa_{1-x}N$ layer 53a and the second p-type $In_xGa_{1-x}N$ layer 53b are stacked in sequence.

Although not illustrated in the drawings, the solar cell 111' according to this example embodiment may further include a lens which may be provided above the first heating portion 121 and the second heating portion 131, corresponding to the area where the plurality of $In_xGa_{1-x}N$ p-n junction layers 40, 50 are formed, and focuses sunlight from outside.

Figure 7:
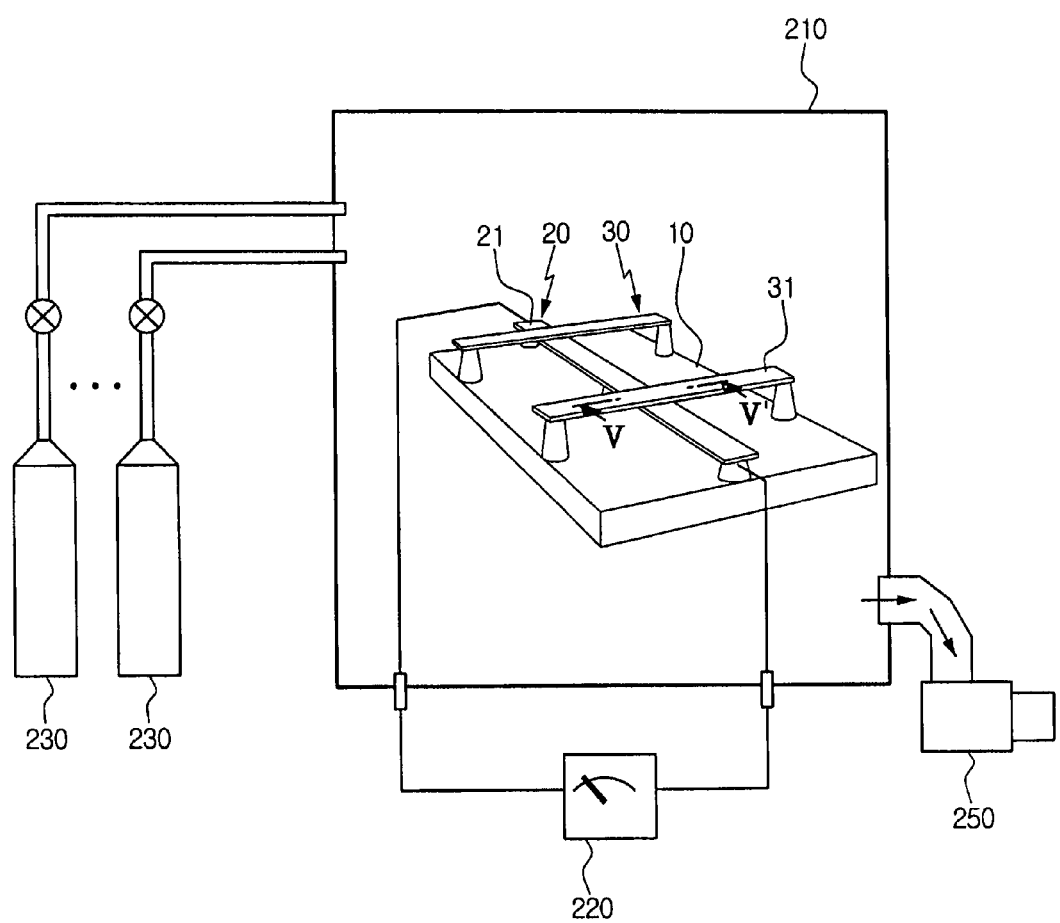
FIG. 7 is a schematic view of a process of forming a solar cell having a plurality of $In_xGa_{1-x}N$ p-n junction layers using a micro-heater array according to an example embodiment.
Figure 8A:
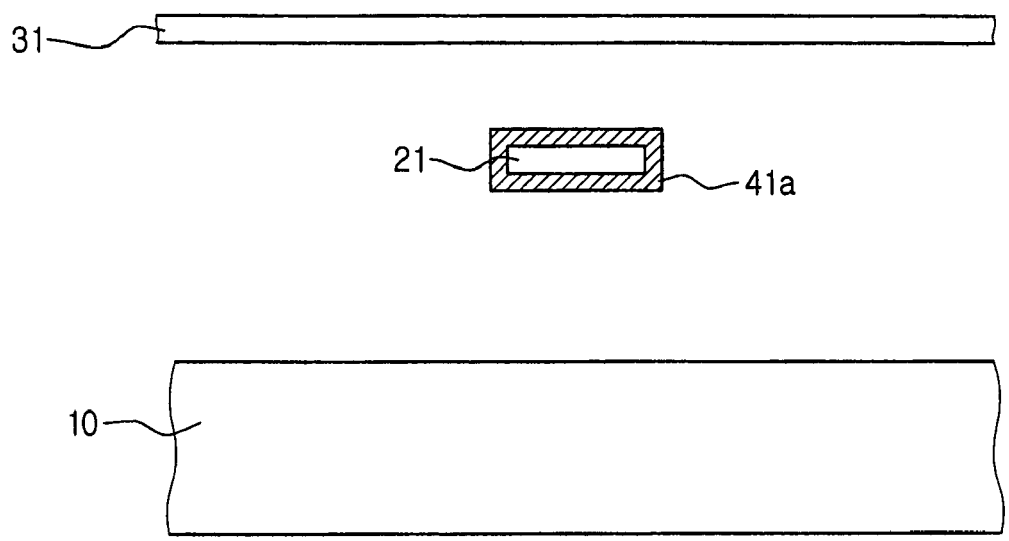
FIG. 8A through FIG. 8C are cross-sectional views along line V-V' of FIG. 7 illustrating an example of forming a plurality of $In_xGa_{1-x}N$ p-n junction layers at the juncture of the first and second heating portions.
Figure 8B:
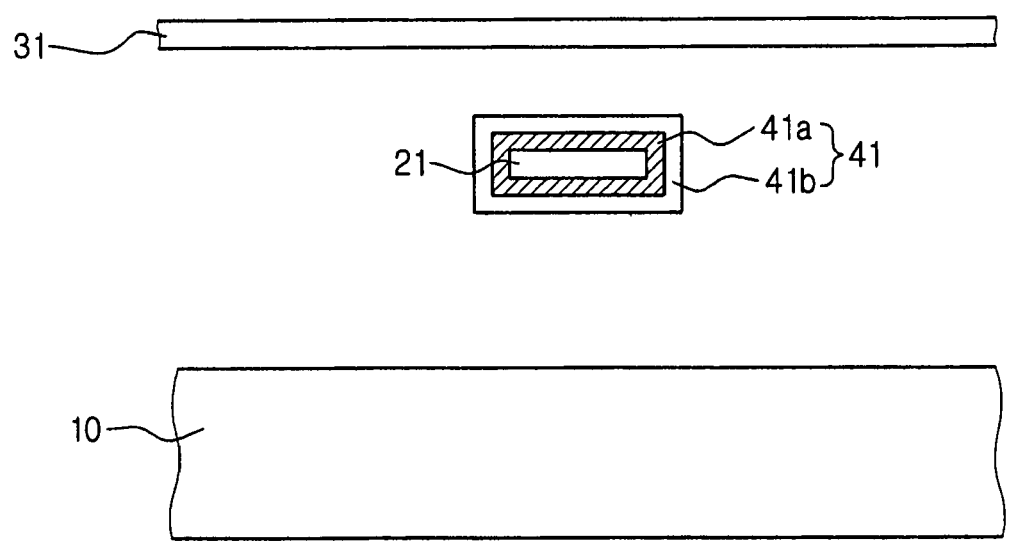
Figure 8C:
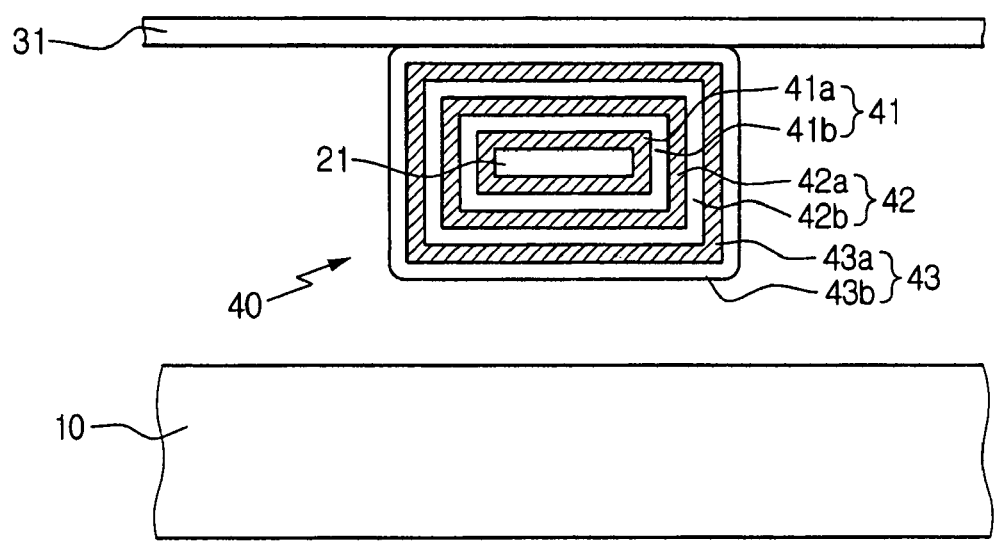

FIG. 7 is a drawing for illustrating a process of forming a solar cell having a plurality of $In_xGa_{1-x}N$ p-n junction layers using a micro-heater array according to an example embodiment. In FIG. 7, the micro-heater array illustrated in FIG. 1A is drawn in a simplified version, for convenience of illustration. FIG. 8A through FIG. 8c are cross-sectional views along line V-V' in FIG. 7 for illustrating an example of forming a plurality of $In_xGa_{1-x}N$ p-n junction layers at the intersection area of the first and second heating portions.

Referring to FIG. 7 through FIG. 8c, a method for forming a plurality of $In_xGa_{1-x}N$ p-n junction layer using a micro-heater array according to an example embodiment is as follows.

A micro-heater array may be provided in a chamber 210. A voltage may be applied from an external power supply 220 to one of first and second micro-heaters 20, 30. In this example embodiment, a voltage may be applied to the first micro-heater 20 to heat a first heating portion 21 to a relatively high temperature. The first heating portion 21 generates high-temperature radiation heat, commonly in the form of visible ray or IR.

Outside the chamber 210, a plurality of gas supply pipes 230 for supplying TMIn, TEGa and $NH_3$, which are source gases of In, Ga and N of the host material $In_xGa_{1-x}N$, respectively, and for supplying $Cp_2Mg$, which is a p-type doping gas, and $SiH_4$, which is an n-type doping gas, into the chamber 210 are provided. By adjusting the supply amount of the TMIn, TEGa and $NH_3$, the plurality of $In_xGa_{1-x}N$ p-n junction layers 40 may be formed to have various compositions.

By supplying the source gases TMIn, TEGa and $NH_3$, and the p-type doping gas $Cp_2Mg$ into the chamber 210 via the gas supply pipes 230 connected to the chamber 210, a first p-type $In_xGa_{1-x}N$ layer 41a may be grown on the first heating portion 21 heated by the applied voltage, as illustrated in FIG. 8A.

The source gases and the p-type doping gas supplied into the chamber 210 react directly on the first heating portion 21, which is at a relatively high temperature, to grow the first p-type $In_xGa_{1-x}N$ layer 41a. The growth region of the first p-type $In_xGa_{1-x}N$ layer 41a may be controlled depending on processing conditions, for example, by varying heating temperature or heating time at the first heating portion 21. The first p-type $In_xGa_{1-x}N$ layer 41a may be formed on only the top surface of the first heating portion 21 or on both the top and bottom surfaces of the first heating portion 21.

Because relatively high-temperature heating is possible at the second area of the first heating portion 21, which does not directly contact the first supports 22, the first p-type $In_xGa_{1-x}N$ layer 41a may be grown mainly at the second area of the first heating portion 21.

While maintaining the heating status of the first heating portion 21, the source gases TMIn, TEGa and $NH_3$, and the n-type doping gas $SiH_4$ may be supplied into the chamber 210, so as to grow a first n-type $In_xGa_{1-x}N$ layer 41b on the first p-type $In_xGa_{1-x}N$ layer 41a, as illustrated in FIG. 8B. The source gases and the n-type doping gas supplied into the chamber 210 react directly on the first heating portion 21, which is at a relatively high temperature, and the first n-type $In_xGa_{1-x}N$ layer 41b is grown on the first p-type $In_xGa_{1-x}N$ layer 41a. As a result, a first $In_xGa_{1-x}N$ p-n junction layer 41 is formed between the first and second heating portions 21, 31.

While controlling the supply amount of the source gases, p-type doping gas and n-type doping gas, the process of growing the p-type $In_xGa_{1-x}N$ layer and the n-type $In_xGa_{1-x}N$ layer may be repeated to form a plurality of $In_xGa_{1-x}N$ p-n junction layers 40 with different x values on the first heating portion 21. Each of thus formed plurality of $In_xGa_{1-x}N$ p-n junction layers 40 may be electrically connected with the first and second heating portions 21, 31, respectively.

Also, as illustrated in FIG. 8c, after the formation of the plurality of $In_xGa_{1-x}N$ p-n junction layers 40, a process of annealing the plurality of $In_xGa_{1-x}N$ p-n junction layers 40 may be added. Through the annealing, the plurality of $In_xGa_{1-x}N$ p-n junction layers 40 may be crystallized or the contact resistance between the plurality of $In_xGa_{1-x}N$ p-n junction layers 40 and the first and second heating portions 21, 31 may be reduced.

A scrubber 250 may be provided below the chamber 210 to absorb and neutralize the gas remaining in the chamber 210 after the formation of the plurality of $In_xGa_{1-x}N$ p-n junction layers 40.

In the above, an example of forming the plurality of $In_xGa_{1-x}N$ p-n junction layers 40 by an MOCVD process using a micro-heater array according to an example embodiment has been described. When the micro-heater array is used, only the first or second heating portions 21, 31, at which the plurality of $In_xGa_{1-x}N$ p-n junction layers 40 are formed, can be locally heated at a relatively high temperature while maintaining the temperature inside the chamber, particularly the temperature of the substrate 10, at room temperature, unlike the typical MOCVD process. Accordingly, $In_xGa_{1-x}N$ p-n junction layers requiring a high-temperature heating may be formed on a glass substrate. Furthermore, since plasma or other complicated heating tools are not required to form the $In_xGa_{1-x}N$ p-n junction layers, the fabrication process may be simplified and the solar cell production cost may be reduced.

Because the plurality of $In_xGa_{1-x}N$ p-n junction layers 40 may be directly grown on the first and second heating portions 21, 31 using the relatively high-temperature heat generated from the first and second heating portions 21, 31, the solar cell fabrication process may be simplified.

A plurality of $In_xGa_{1-x}N$ p-n junction layers may be formed on the first heating portion 21 by forming an n-type $In_xGa_{1-x}N$ layer on the first heating portion 21 first, and then growing a p-type $In_xGa_{1-x}N$ layer on the n-type $In_xGa_{1-x}N$ layer.

As illustrated in FIG. 6B, after the formation of the plurality of $In_xGa_{1-x}N$ p-n junction layers 40, a process of forming a p-type $In_xGa_{1-x}N$ layer 51a which contacts the plurality of $In_xGa_{1-x}N$ p-n junction layers 40 may be added. Specifically, by applying a voltage to the second micro-heater 130 and supplying source gases and a p-type doping gas into the chamber 210, the p-type $In_xGa_{1-x}N$ layer 52a, which contacts the outermost layer of the plurality of $In_xGa_{1-x}N$ p-n junction layers 40, may be formed on the second heating portion 131 heated by the applied voltage.

As illustrated in FIG. 6C, after the formation of the plurality of $In_xGa_{1-x}N$ p-n junction layers 40, a process of forming a plurality of $In_xGa_{1-x}N$ p-n junction layers 50, which contact the plurality of $In_xGa_{1-x}N$ p-n junction layers 40 formed on the first heating portion 121, on the second heating portion 131 may be further added. Specifically, by applying a voltage to the second micro-heater 130 and supplying source gases and an n-type doping gas into the chamber 210, a first n-type $In_xGa_{1-x}N$ layer 52a may be formed on the second heating portion 131 heated by the applied voltage. Then, source gases and p-type doping gas may be supplied into the chamber 210 to grow a first p-type $In_xGa_{1-x}N$ layer 52b on the first n-type $In_xGa_{1-x}N$ layer 52a.

While controlling the supply amount of source gases, n-type doping gas and p-type doping gas, the process of growing a second n-type $In_xGa_{1-x}N$ layer 53a and a second p-type $In_xGa_{1-x}N$ layer 53b may be repeated to form the plurality of $In_xGa_{1-x}N$ p-n junction layer 50 with different x values on the second heating portion 131.

The outermost layer of the plurality of $In_xGa_{1-x}N$ p-n junction layer 50 formed on the second heating portion 131 contacts the outermost layer of the plurality of $In_xGa_{1-x}N$ p-n junction layers 40 formed on the first heating portion 121. The outermost layers may be different type of $In_xGa_{1-x}N$ layers.

Accordingly, a plurality of $In_xGa_{1-x}N$ p-n junction layers may be provided continuously between the first and second heating portions 121, 131.

As described, in the example embodiments, because a plurality of $In_xGa_{1-x}N$ p-n junction layers are formed using a micro-heater array, the temperature of the substrate may be maintained near the room temperature during the formation of the plurality of $In_xGa_{1-x}N$ p-n junction layers. Accordingly, it is possible to form the plurality of $In_xGa_{1-x}N$ p-n junction layers on a glass substrate, and, therefore, to fabricate relatively large-sized, high-efficiency solar cells.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. A solar cell comprising:
   a substrate;
   a first micro-heater having a first heating portion and first supports, the first heating portion extending in a first direction and spaced apart from the substrate by the first supports;
   a second micro-heater having a second heating portion and second supports, the second heating portion extending in a second direction so as to traverse the first heating portion while being spaced apart from the substrate by the second supports; and
   a plurality of $In_xGa_{1-x}N$ p-n junction layers at a juncture of the first and second heating portions, x being a number from 0 to 1 and each of the plurality of $In_xGa_{1-x}N$ p-n junction layers having a different value for x, the plurality of $In_xGa_{1-x}N$ p-n junction layers being electrically-connected to the first and second heating portions and wherein the first and second supports are directly disposed on the substrate.

2. The solar cell of claim 1, wherein the substrate is made of a glass material.

3. The solar cell of 1, further comprising:
   a lens above the second heating portion, the lens focusing sunlight onto the plurality of $In_xGa_{1-x}N$ p-n junction layers.

4. The solar cell of claim 1, wherein the plurality of $In_xGa_{1-x}N$ p-n junction layers have a multilayer structure, and an outer layer of the plurality of p-n junction layers has a smaller x value than that of an inner layer of the plurality of $In_xGa_{1-x}N$ p-n junction layers.

5. The solar cell of claim 1, wherein the second heating portion has an opening at the juncture of the first and second heating portions.

6. The solar cell of claim 1, wherein the second heating portion is formed of a transparent electrode material.

7. The solar cell of claim 1, wherein the first supports are between the substrate and the first heating portion, and the second supports are between the substrate and the second heating portion.

8. The solar cell of claim 1, wherein:
   the first micro-heater further comprises first connecting portions extending from opposing sides of the first heating portion and arranged along a length of the first heating portion while being spaced apart from each other,
   the second micro-heater further comprises second connecting portions extending from opposing sides of the second heating portion and arranged along a length of the second heating portion while being spaced apart from each other, and the first supports are between the substrate and the first connecting portions so as to support the first heating portion and the first connecting portions, and the second supports are between the substrate and the second connecting portions so as to support the second heating portion and the second connecting portions.

9. The solar cell of claim 1, wherein:

the first micro-heater further comprises first connecting portions extending from opposing sides of the first heating portion and arranged along a length of the first heating portion while being spaced apart from each other, and the first supports are between the substrate and the first connecting portions so as to support the first heating portion and the first connecting portions, and the second supports are between the substrate and the second heating portion so as to support the second heating portion.

10. The solar cell of claim 1, wherein:

the second micro-heater further comprises second connecting portions extending from opposing sides of the second heating portion and arranged along a length of the second heating portion while being spaced apart from each other, and the second supports are between the substrate and the second connecting portions so as to support the second heating portion and the second connecting portions, and the first supports are between the substrate and the first heating portion so as to support the first heating portion.

* * * * *